(12) United States Patent
Li et al.

(10) Patent No.: US 10,741,705 B2
(45) Date of Patent: Aug. 11, 2020

(54) OPTOELECTRONIC DEVICE HAVING AN ANTIREFLECTIVE SURFACE

(71) Applicant: The Board of Trustees of the University of Illinois, Urbana, IL (US)

(72) Inventors: Xiuling Li, Champaign, IL (US); Jeong Dong Kim, Savoy, IL (US); Munho Kim, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 16/034,774

(22) Filed: Jul. 13, 2018

(65) Prior Publication Data
US 2019/0019901 A1 Jan. 17, 2019

Related U.S. Application Data

(60) Provisional application No. 62/532,473, filed on Jul. 14, 2017.

(51) Int. Cl.
| | |
|---|---|
| *H01L 31/0232* | (2014.01) |
| *H01L 31/032* | (2006.01) |
| *H01L 31/0236* | (2006.01) |
| *H01L 31/0224* | (2006.01) |
| *H01L 31/108* | (2006.01) |

(52) U.S. Cl.
CPC .. *H01L 31/02327* (2013.01); *H01L 31/02363* (2013.01); *H01L 31/022408* (2013.01); *H01L 31/032* (2013.01); *H01L 31/108* (2013.01)

(58) Field of Classification Search
CPC ....... H01L 31/02327; H01L 31/022408; H01L 31/108; H01L 31/032

USPC ................................................. 257/89, 432
See application file for complete search history.

(56) References Cited

U.S. PATENT DOCUMENTS

| | | | |
|---|---|---|---|
| 8,937,299 B2 | 1/2015 | Basu et al. | |
| 8,951,430 B2 | 2/2015 | Li et al. | |
| 9,224,809 B2 | 12/2015 | Li et al. | |
| 2011/0126903 A1* | 6/2011 | Kobayashi | H01L 31/02168 |
| | | | 136/256 |
| 2011/0266521 A1 | 11/2011 | Ferrari et al. | |
| 2012/0021555 A1* | 1/2012 | Tu | B82Y 10/00 |
| | | | 438/71 |
| 2013/0078750 A1* | 3/2013 | Yeo | B81C 1/00031 |
| | | | 438/29 |

(Continued)

OTHER PUBLICATIONS

Balasundaram, Karthik et al., "Photonic crystal membrane reflectors by magnetic field-guided metal-assisted chemical etching," *Appl. Phys. Lett.* 103, 214103 (2013) 4 pp.

(Continued)

*Primary Examiner* — Igwe U Anya
(74) *Attorney, Agent, or Firm* — Brinks Gilson & Lione

(57) ABSTRACT

An optoelectronic device with an antireflective surface comprises a semiconductor substrate having a textured surface including a plurality of surface protrusions and/or indentations. A first electrode is in contact with the semiconductor substrate and spaced apart from a second electrode that is also in contact with the semiconductor substrate. The textured surface is fabricated by inverse metal-assisted chemical etching, and thus the semiconductor substrate is substantially devoid of ion-induced defects.

21 Claims, 6 Drawing Sheets

(56) References Cited

U.S. PATENT DOCUMENTS

| | | | |
|---|---|---|---|
| 2015/0037048 A1* | 2/2015 | Na | H01L 31/02161 |
| | | | 398/214 |
| 2015/0221791 A1* | 8/2015 | Harada | H01L 31/0747 |
| | | | 136/256 |

OTHER PUBLICATIONS

Bardwell, J.A., et al., "Ultraviolet photoenhanced wet etching of GaN in $K_2S_2O_8$ solution," *Journal of Applied Physics*, 89:7 (2001) pp. 4142-4148.

Boyd, Darryl et al., "Periodically patterned germanium surfaces modified to form superhydrophobic, IR-transmissive substrates," *Optical Materials Express*, 6:10 (2016) pp. 3254-3261.

Buckley, Donald H., "Adhesion and Friction Behavior of Group IV Elements Germanium, Silicon, TIN, and Lead," *NASA Technical Note, NASA TN D-7930*, (1975) 19 pp.

Campbell, Patrick et al., "Light trapping properties of pyramidally textured surfaces," *Journal of Applied Physics*, 62:243 (1987) pp. 248-249.

Carrano, J.C. et al., "Very low dark current metal-semiconductor-metal ultraviolet photodetectors fabricated on single-crystal GaN epitaxial layers," *Appl. Phys. Lett.* 70, (1997) 1992-1994.

Chen, Long et al., "High performance germanium photodetectors integrated on submicron silicon waveguides by low temperature wafer bonding," *Optics Express*, 16:5 (2008) pp. 11513-11518.

Chen, Xiaping et al., "High-performance 4H-SiC-based ultraviolet p-i-n. photodetector," *Journal of Applied Physics*, 102, 024505 (2007) 4 pp.

Cheung C. L. et al., Fabrication of nanopillars by nanosphere lithography, *Nanotechnology*, 17 (2006) pp. 1339-1343.

Ciftcioglu, Berkehan et al., "An 850-nm Normal-Incidence Germanium Metal-Semiconductor-Metal Photodetector With 13-GHz Bandwidth and 8-µA Dark Current," *IEEE Photonics Technology Letters*, 22:24 (2010) pp. 1850-1852.

DeJarld, Matt et al., "Formation of High Aspect Ratio GaAs Nanostructures with Metal-Assisted Chemical Etching," *Nano Letters*, 11 (2011) pp. 5259-5263.

Eddowes, M.J. "Anodic dissolution of p- and n-type silicon Kinetic study of the chemical mechanism," *J. Electroanal. Chem.*, 280 (1990) pp. 297-311.

Feng, P. et al., "Individual $\beta$-$Ga_2O_3$ nanowires as solar-blind photodetectors," *Appl. Phys. Lett.* 88 (2006) pp. 3 pp.

Garnett, Erik et al., Light Trapping in Silicon Nanowire Solar Cells, *Nano Letters*, 10 (2010) pp. 1082-1087.

Geller, S. "Crystal Structure $\beta$-$Ga_2O_3$," *The Journal of Chemical Physics*, 33:3 (1960) pp. 676-684.

Guo, Daoyou et al., "Fabrication of $\beta$-$Ga_2O_3$ thin films and solar-blind photodetectors by laser MBE technology," *Optical Materials Express*, 4:5 (2014) pp. 1067-1076.

Hanada, Kenji et al., "Observation of nanometer-sized crystalline grooves in as-grown $\beta$-$Ga_2O_3$ single crystals," *Japanese Journal of Applied Physics*, 55 030303 (2016) 4 pp.

Heinemann, M.D., et al., "Oxygen deficiency and Sn doping of amorphous $Ga_2O_3$, *Appl. Phys. Lett.*, 108, 022107 (2016) 4 pp.

Helms, C.R. et al., "Observation of strong bulk oxidation effects in amorphous germanium by ultraviolet reflectance spectroscopy," *Appl. Phys. Lett.*, 24 (1974) pp. 318-320.

Higashiwaki, Masataka et al., "Guest Editorial: The dawn of gallium oxide microelectronics," *Applied Physics Letters*, 112, 060401 (2018) 4 pp.

Hildreth, Owen et al., "Effect of Catalyst Shape and Etchant Composition on Etching Direction in Metal-Assisted Chemical Etching of Silicon to Fabricated 3D Nanostructures," *ACS Nano*, 3:12 (2009) pp. 4033-4042.

Ito, Kazuki et al., "Chemical wet etching of germanium assisted with catalytic-metal-particles and electroless-metal deposition," *Electrochimica Acta*. 214 (2016) pp. 354-361.

Jo, Sam Keun, "Surface Reactions of Atomic Hydrogen with Ge(100) in Comparison with Si(100)," *Appl. Sci. Converg. Technol.* 26:6 (2017) pp. 174-178.

Juntunen, Mikko et al., "Near-unity quantum efficiency of broadband black silicon photodiodes with an induced junction," *Nature Photonics*, 10 (2016) pp. 777-781.

Katz, O. et al., "Gain Mechanism in GaN Schottky ultraviolet detectors," *Appl. Phys. Lett.* 79:10 (2001) pp. 1417-1419.

Kazuki, I., et al., "Chemical Wet Etching of Germanium Assisted with Catalytic-Metal-Particles and Electroless-Metal-Deposition," *Electrochimica Acta.*, 2016 (Abstract Only).

Kim, Jaehoon et al., "Formation of GaP nanocones and micro-mesas by metal-assisted chemical etching,"*Phys. Chem Chem Phys.* 18 (2016) pp. 3402-3408.

Kim, Jeong et al., "Scaling the Aspect Ratio of Nanoscale Closely Packed Silicon Vias by MacEtch: Kinetics of Carrier Generation and Mass Transport," *Advanced Functional Materials*, 27, 1605614 (2017) 8 pp.

Kim, Jungkil et al., "Curved Silicon Nanowires with Ribbon-like Cross Sections by Metal-Assisted Chemical Etching," *ACS Nano*, 5:6 (2011) pp. 5242-5248.

Kim, Munho et al., "Flexible germanium nanomembrane metal-semiconductor-metal photodiodes," *Appl. Phys. Lett.*, 109, 051105 (2016) 4 pp.

Kim, Munho et al., "Light absorption enhancement in Ge nanomembrane and its optoelectronic application"*Optics Express*, 24:15 (2016) pp. 16894-16903.

Kim, Munho et al., "Nano-indented Ge surfaces by metal-assisted chemical etching (MacEtch) and its application for optoelectronic devices," *IEEE, 978-15090-6328-4/17* (2017) 2 pp.

Kim, Munho et al., "Recent advances in free-standing single crystalline wide band-gap semiconductors and their applications: GaN, SiC, ZnO, $\beta$-$Ga_2O_3$ and diamond," *Journal of Materials Chemistry C*, 5 (2017) pp. 8338-8354.

Kim, Munho et al., "Transferrable single crystalline 4H-SiC nanomembranes," *Journal of Materials Chemistry C*, 5 (2017) pp. 264-468.

Kim, Seung et al., "Inverse Metal-Assisted Chemical Etching Produces Smooth High Aspect Ratio InP Nanostructures," *Nano Letters*, 15 (2015) pp. 641-648.

Koide, Yasuo et al., "Thermally stable solar-blind diamond UV photodetector," *Science Direct*, 15 (2006) pp. 1962-1966.

Kong, Lingyu et al., "Damage-Free Smooth Sidewall InGaAs Nanopillar Array by Metal-Assisted Chemical Etching," *ACS Nano*, 11 (2017) pp. 10193-10205.

Kong, Wei-Yu et al., "Graphene- $\beta$-$Ga_2O_3$ Heterojunction for Highly Sensitive Deep UV Photodetector Application," *Advanced Materials*, 28 (2016) pp. 10725-10731.

Lee, Seunghyo et al., "Metal-assisted chemical etching of Ge surface and its effect on photovoltaic devices," *Applied Surface Science*, 371 (2016) pp. 129-138.

Leem, Jung et al., "Tunable behavior of reflectance minima in periodic Ge submicron grating structures,"*Journal Optical Society of America B*, 29:3 (2012) pp. 357-362.

Leem, Jung Woo et al., "Broadband antireflective germanium surfaces based on subwavelength structures for photovoltaic cell applications," *Optic Express*, 19:27 (2011) pp. 26308-26317.

Li, Junshuai et al., "Low aspect-ratio hemispherical nanopit surface texturing for enhancing light absorption in crystalline Si thin film-based solar cells," *Appl. Phys. Lett.* 98, 021905 (2011) 3 pp.

Li, Liang et al., "Ultrahigh-Performance Solar-Blind Photodetectors Based on Individual Single-crystalline $In_2Ge_2O_7$ Nanobelts."*Advanced Materials*, 22 (2010) pp. 5145-5149.

Li, X. et al., "Metal-assisted chemical etching in $HF/H_2O_2$ produces porous silicon," *Appl. Phys. Lett.* 77:16 (2000) pp. 2572-2574.

Li, Xiuling et al., "In-plane bandgap control in porous GaN through electroless wet chemical etching," *Appl. Phys. Lett.* 80:6 (2002) pp. 980-982.

Li, Xiuling, "Metal assisted chemical etching for high aspect ratio nanostructures: A review of characteristics and applications in photovoltaics," *Current Opinion in Solid State and Materials Science*, 16 (2012) pp. 71-81.

(56) References Cited

OTHER PUBLICATIONS

Li, Yunfeng et al., "Antireflective surfaces based on biomimetic nanopillared arrays," *Science Direct, Nano Today* 5 (2010) pp. 117-127.
Lie, F.L. et al., "$In_{0.53}Ga_{0.47}As(100)$ native oxide removal by liquid and gas phase $HF/H_2O$ chemistries," *Microelectronic Engineering*, 87 (2010) pp. 1656-1660.
Liu, Runyu et al., "Enhanced Optical Transmission through MacEtch-Fabricated Buried Metal Gratings," *Advanced Materials*, 28 (2016) pp. 1441-1448.
Michel, Jurgen et al., "High-performance Ge-on-Si photodetectors." *Nature Photonics*, 4 (2010) pp. 527-534.
Miyazaki, Seiichi, "Characterization of high-k gate dielectric/silicon interfaces," *Applied Surface Science*, 190 (2002) pp. 66-74.
Mohseni, Parsian, "GaAs pillar array-based light emitting diodes fabricated by metal-assisted chemical etching," *Journal of Applied Physics*, 114, 064909 (2013) 6 pp.
Na, Seok-In et al., "Selective Wet Etching of p-GaN for Efficient GaN-Based Light-Emitting Diodes," *IEEE Photonics Technology Letters* 18:14 (2006) pp. 1512-1514.
Oh, Jihun et al., "An 18.2%-efficient black-silicon solar cell achieved through control of carrier recombination in nanostructures," *Nature Nanotechnology*, 7 (2012) pp. 743-748.
Oh, Jungwoo et al., "Metal-Germanium-Metal Photodetectors on Heteroepitaxial Ge-on-Si With Amorphous Ge Shottky Barrier Enhancement Layers," *IEEE Photonics Technology Letters*, 16:2 (2004) pp. 581-583.
Oh, Sooyeoun et al., "Quasi-two-dimensional β-gallium oxide solar-blind photodetectors with ultrahigh responsivity," *Journal of Materials Chemistry C*, 4 (2016) pp. 9245-9250.
Ohira, Shigeo et al., "Wet chemical etching behavior of $\beta-Ga_2O_3$ single crystal" *phys. stat. sol.* (c), 5, No. 9 (2008) pp. 3116-3118.
Onsia, B. et al., "A Study of the Influence of Typical Wet Chemical Treatments on the germanium Wafer Surface," *Solid State Phenomena*, 103-104 (2005) pp. 19-22.
Orita, Masahiro et al., "Deep-ultraviolet transparent conductive $\beta-Ga_2O_3$ thin films," *Applied Physics Letters*, 77:25 (2000) pp. 4166-4168.
Oshima, Takayoshi et al., Vertical Solar-Blind Deep Ultraviolet Schottky Photodetectors Based on $\beta-Ga_2O_3$ Substrates, *Applied Physics Express*, 1 (2008), 011202, 3 pp.
Otto, Martin et al., "Extremely low surface recombination velocities in black silicon passivated by atomic layer deposition," *Appl. Phys. Lett.*, 100, 191603, (2012) 4 pp.
Patil-Chaudhari, Dewyani et al., "Solar Blind Photodetectors Enabled by Nanotextured $\beta-Ga_2O_3$ Films Grown via Oxidation on GaAs Substrates," *IEEE Photonics Journal*, 9:2 (2017) 7 pp.
Peng, Kuiqing et al., "Fabrication of Single-Crystalline Silicon Nanowires by Scratching a Silicon Surface with Catalytic Metal Particles," *Advanced Functional Materials*, 16 (2006) pp. 387-394.
Ray, Samit K. et al., "Structural and optical properties of germanium nanostructures on Si(100) and embedded in high-k oxides," *Nanoscale Research Letters*, 6:224 (2011) 10 pp.
Razeghi, Manijeh, "Short-Wavelength Solar-Blind Detectors-Status Prospects, and Markets," *Proceedings of the IEEE*, 90:6 (2002) pp. 1006-1014.
Rittenhouse, Tilghman et al., "Structural and spectroscopic characterization of porous silicon carbide formed by Pt-assisted electroless chemical etching," *Solid State Communications*, 126 (2003) pp. 245-250.

Sang, Liwen et al., "A Comprehensive Review of Semiconductor Ultraviolet Photodetectors: From Thin Film to One-Dimensional Nanostructures," *Sensors*, 13 (2013) pp. 10482-10518.
Shin, Jae et al., "Experimental Study of Design Parameters in Silicon Micropillar Array Solar Cells Produced by Soft Lithography and Metal-Assisted Chemical Etching," *IEEE Journal of Photovoltaics*, 2:2 (2012) pp. 129-133.
Soci, C. et al., "ZnO Nanowire UV Photodetectors with High Internal Gain," *Nano Letters*, 7:4 (2007) pp. 1003-1009.
Soltani, A. et al., "193 nm deep-ultraviolet solar-blind cubic boron nitride based photodetectors," *Applied Physics Letters*, 92, 053501 (2008) 3 pp.
Song, Yi et al., "Ultra-High Aspect Ratio InP Junctionless FinFETs by a Novel Wet Etching Method," *IEEE Electron Device Letters*, 37:8 (2016) pp. 970-973.
Song, Yunwon et al., "In-plane and out-of-plane mass transport during metal-assisted chemical etching of GaAs," *Journal of Materials Chemistry A*, 2 (2014) pp. 11017-11021.
Southwell, W. H., "Gradient-index antireflection coatings," *Optics Letters*, 8:11 (1983) pp. 584-586.
Suzuki, Rikiya et al., "Enhancement of responsivity in solar-blind $\beta-Ga_2O_3$ photodiodes with a Au Schottky contact fabricated on single crystal substrates by annealing," *Appl. Phys. Lett.*, 94, 222102, (2009) 3 pp.
Tippins, H.H., Optical Absorption and Photoconductivity in the Band Edge of $\beta-Ga_2O_3$, *Physical Review*, 140:1A (1965) pp. A316-A319.
Tsai, Dung-Sheng et al., "Solar-Blind Photodetectors for Harsh Electronics," *Scientific Reports*, 3:2628 (2013) 5 pp.
Varley, J. B. et al., "Role of self-trapping in luminescence and p-type conductivity of wide-band-gap oxides," *Physical Review B*, 85, 081109(R), (2012) 4 pp.
Wilhelm, Thomas et al., "Fabrication of Suspended III-V Nanofoils by Inverse Metal-Assisted Chemical Etching of $In_{0.49}Ga_{0.51}P/GaAs$ Heteroepitaxial Films," *ACS Applied Materials & Interfaces*, 10 (2018) pp. 2058-2066.
Wu, Chih-Hung et al., "Amorphous Ge Passivation Effects on Ge Solar Cells," *IEEE Journal of Photovoltaics*, 4:3 (2014) pp. 968-971.
Wuu, Dong-Sing et al., "Growth and characterization of Ga2O3 on sapphire substrates for UV sensor applications," *Proceedings of SPIE*, 9263 (2012) 7 pp.
Xia, Zhenyang et al., "Single-crystalline germanium nanomembrane photodetectors on foreign nanocavities," *Science Advances*, 3:e1602783 (2017) 8 pp.
Xing, Jie et al., "Solar-blind deep-ultraviolet photodetectors based on an $LaAlO_3$ single crystal," *Optics Letters*, 34:11 (2009) pp. 1675-1677.
Yao, Yao et al., "Electrical behavior of $\beta-Ga_2O_3$ Schottky diodes with different Schottky metals," *Journal of Vacuum Science & Technology B*, vol. 35, No. 3, 03D113-2 (2017) 7 pp.
Youngblood, Nathan et al., "Waveguide-integrated black phosphorus photodetector with high responsivity and low dark current," *Nature Photonics*, 9 (2015) pp. 247-252.
Yu, Zongfu et al., "Fundamental limit of nanophotonic light trapping in solar cells," *PNAS*, 107:40 (2010) pp. 17491-17496.
Zang, Hwan-Jun et al., "Asymmetrically contacted germanium photodiode using a metal-interlayer-semiconductor-metal structure for extremely large dark current suppression," *Optics Letters*, 41:16 (2016) pp. 3686-3689.
Zhou, Qiugui et al., "Nanosphere natural lithography surface texturing as anti-reflective layer on SiC photodiodes," *Optics Express*, 19:24 (2011) pp. 23664-23670.

\* cited by examiner

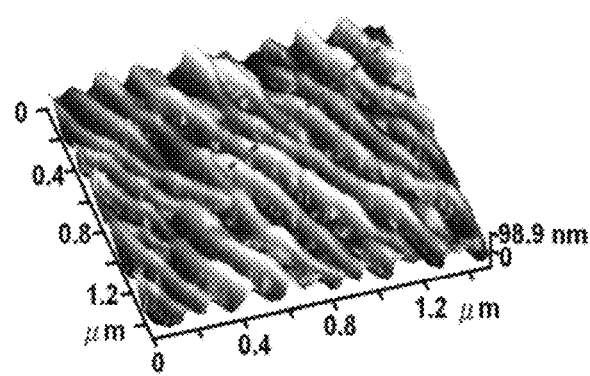
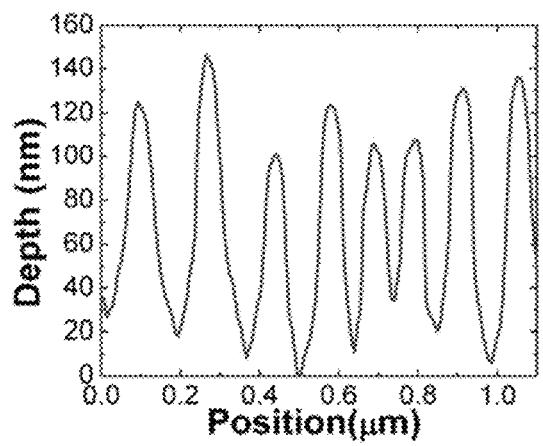
FIG. 4C  FIG. 4D
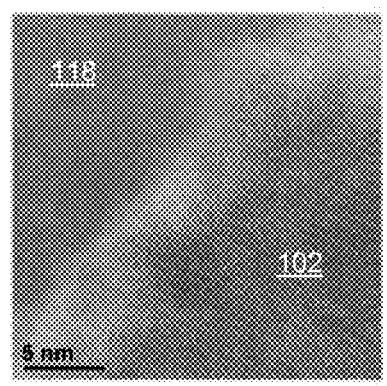
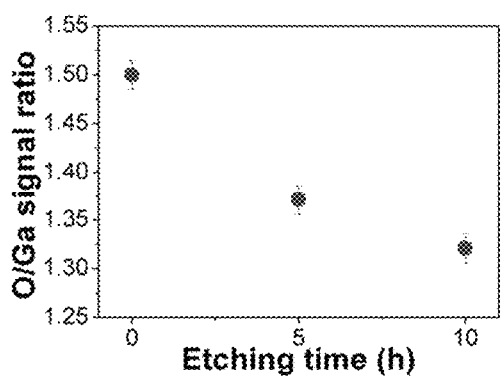
FIG. 5A  FIG. 5B
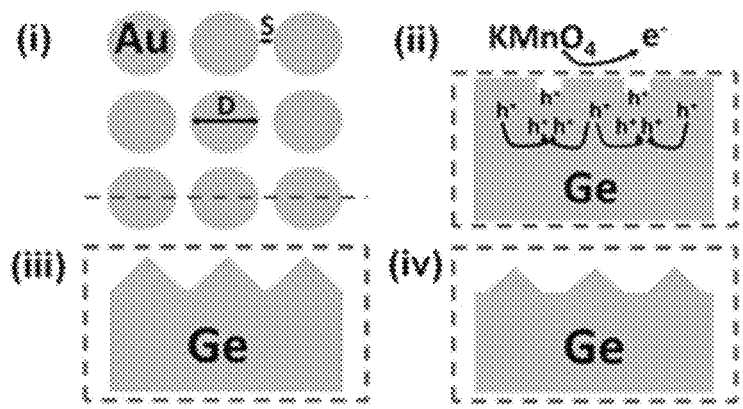
FIG. 6

OPTOELECTRONIC DEVICE HAVING AN ANTIREFLECTIVE SURFACE

RELATED APPLICATIONS

The present patent document claims the benefit of priority under 35 U.S.C. § 119(e) to U.S. Provisional Patent Application No. 62/532,473, filed Jul. 14, 2017, which is hereby incorporated by reference in its entirety.

FEDERALLY SPONSORED RESEARCH OR DEVELOPMENT

This invention was made with government support under contract number 14-62946 awarded by the National Science Foundation. The government has certain rights in the invention.

TECHNICAL FIELD

The present disclosure is related generally to chemical etching and more particularly to optoelectronic devices having antireflective surfaces fabricated by inverse metal-assisted chemical etching.

BACKGROUND

Surface reflection is a phenomenon that occurs due to the refractive index difference between air and surfaces. It is one of the major limiting factors of light absorption efficiency in photovoltaic and optoelectronic devices. Consequently, there has been considerable interest in light trapping management of various semiconductor material surfaces. For example, coating of antireflection (or antireflective) (AR) layers on semiconductors has been shown to reduce surface reflections, but the coatings may be effective for only certain optical bandwidths and over a limited angular range. Direct formation of AR microstructures on semiconductor surfaces using reactive ion etching (RIE) has been explored to address the shortcomings of traditional AR coatings, but RIE can induce damage that diminishes device performance.

Photodetectors are optoelectronic devices employed for light sensing across various wavelength ranges—e.g., from infrared (IR) to ultraviolet (UV). Detection of longer wavelengths, such as near-infrared (NIR) wavelengths, is important for various applications, including optical fiber communications, remote sensing of the environment, monitoring of industrial processes and pollution, automotive security, biology and medicine. Shorter wavelength UV detectors are of interest due to potential applications in air purification, flame detection, and missile guidance, among others. In many UV detection applications, it is highly desirable to detect UV light without sensing visible or IR light, or solar UV wavelengths longer than 280 nm that can penetrate the Earth's atmosphere. Thus, UV detectors with a cut-off below 280 nm are sought after. Such "solar-blind" photodetectors ideally respond only to UV radiation with wavelengths shorter than the solar radiation that reaches the Earth and produce no measurable signal when exposed to normal outdoor lighting.

BRIEF SUMMARY

An optoelectronic device with an antireflective surface is described along with a method of making the optoelectronic device.

The optoelectronic device comprises a semiconductor substrate having a textured surface which includes a plurality of surface protrusions and/or indentations. A first electrode is in contact with the semiconductor substrate and spaced apart from a second electrode that is also in contact with the semiconductor substrate. The textured surface is fabricated by inverse metal-assisted chemical etching, and thus the semiconductor substrate is substantially devoid of ion-induced defects.

A method of forming an optoelectronic device by inverse metal-assisted chemical etching comprises applying a metal catalyst pattern to a surface of a semiconductor substrate; exposing the metal catalyst pattern and the semiconductor substrate to an etching solution including an oxidant and an acid, whereby regions of the surface of the semiconductor substrate away from the metal catalyst pattern are etched; carrying out the etching for a time sufficient to form a textured surface comprising a plurality of surface protrusions and/or indentations on the semiconductor substrate; removing the metal catalyst pattern; and forming a first electrode and a second electrode in contact with the semiconductor substrate comprising the textured surface, where the first electrode is spaced apart from the second electrode. Thus, an optoelectronic device is formed by inverse metal-assisted chemical etching. The optoelectronic device formed by this method may have any of the characteristics and/or properties set forth in this disclosure.

BRIEF DESCRIPTION OF THE DRAWINGS

FIG. 4C shows a 3D atomic force microscopy (AFM) image of the textured gallium oxide surface of FIG. 4B.

FIG. 4D shows a cross-sectional depth analysis along the dotted scan line shown in FIG. 4C.

FIG. 5A is a high-magnification scanning transmission electron microscopy (STEM) image showing the presence of an amorphous Ge layer on the single crystal Ge substrate after I-MacEtch.

FIG. 5B is a plot of O/Ga signal ratio of a gallium oxide surface as a function of etching time (utilizing I-MacEtch) as determined by x-ray photoelectron spectroscopy (XPS).

FIG. 6 is a schematic (i) of a metal catalyst dot pattern that may be employed to form the textured surface shown in FIG. 2, along with the etching mechanism and process (ii-iv).

DETAILED DESCRIPTION

Described herein are optoelectronic devices fabricated from semiconductors with textured light-absorbing surfaces, which may significantly reduce light reflection and provide other benefits, allowing for improved performance compared to devices having planar light-absorbing surfaces. The optoelectronic devices (e.g., photodetectors, solar cells, etc.) may be prepared using inverse metal-assisted chemical etching, or "I-MacEtch," a wet chemical technique for producing micro- and nanostructures that provides a damage-free alternative to reactive-ion etching.

A typical MacEtch process utilizes a noble metal such as Au, Pt or Ag deposited on a surface of a semiconductor and a chemical solution of an acid and an oxidant to selectively etch regions of the semiconductor underlying the noble metal, which functions as a catalyst for etching. In inverse MacEtch, the process is controlled to enable etching away from the metal catalyst. Because MacEtch and I-MacEtch are wet etch techniques that do not involve high energy ions, surface damage that can significantly degrade device performance can be avoided.

In this work, I-MacEtch is employed to prepare optoelectronic devices including anti-reflective surfaces based on semiconductors such as germanium (Ge) and gallium oxide ($Ga_2O_3$). In the examples described below, germanium and gallium oxide substrates are etched to obtain textured surfaces comprising arrays of protrusions and/or indentations of a predetermined shape (e.g., pyramids, inverted domes, grooves, etc.). Photodiodes fabricated on the MacEtch-textured Ge surfaces show significant improvements in both dark current and spectral responsivity compared to their planar counterparts. Similarly, photodiodes fabricated on textured β-$Ga_2O_3$ surfaces achieve enhanced responsivity at UV wavelengths compared to photodiodes with planar surfaces.

Figure 1:
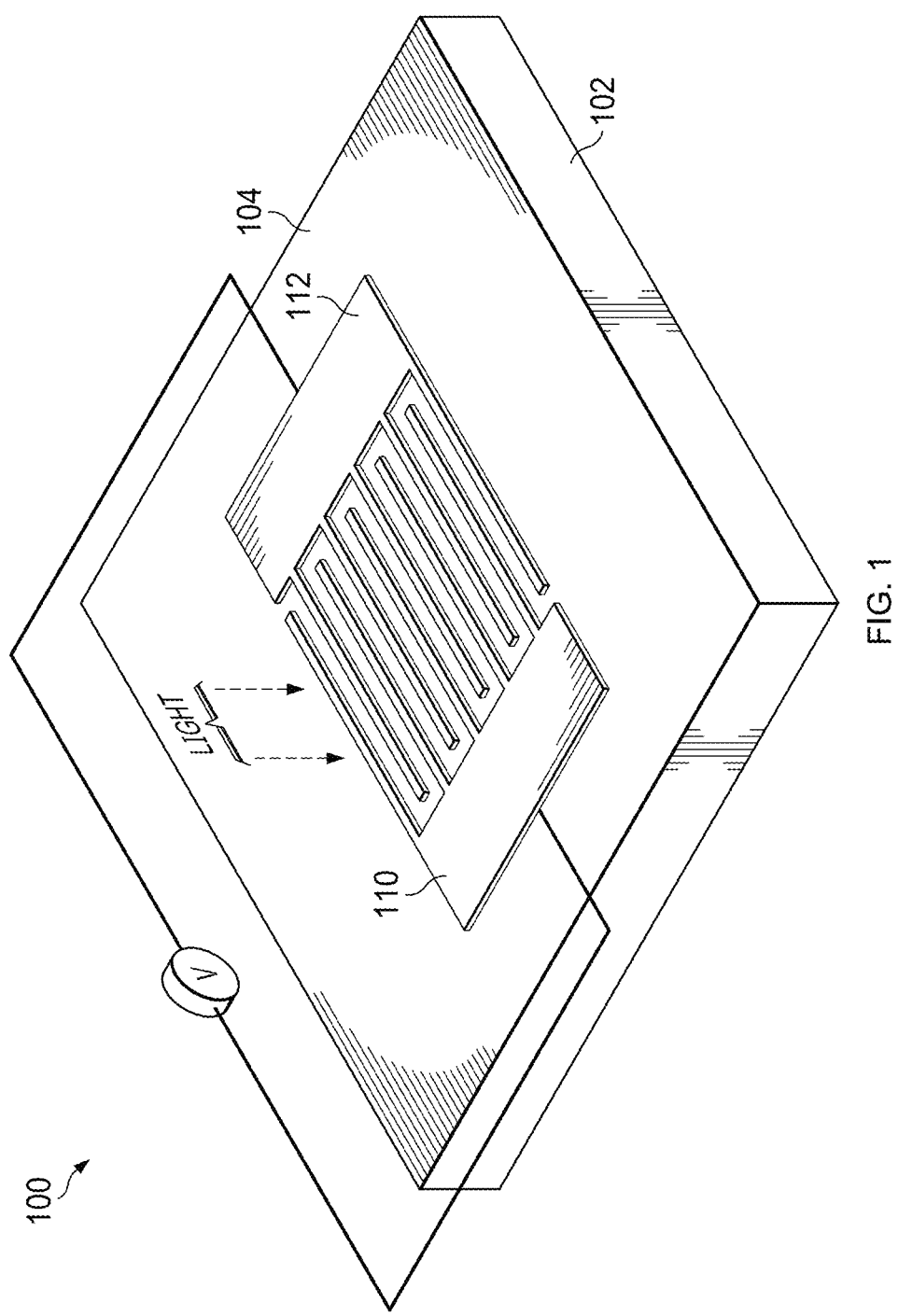
FIG. 1 is a schematic of an exemplary optoelectronic device having an antireflective surface that can be fabricated by inverse metal-assisted chemical etching (I-MacEtch); various examples of the antireflective surface are shown in FIG. 2 through FIG. 4B.
Figure 2:
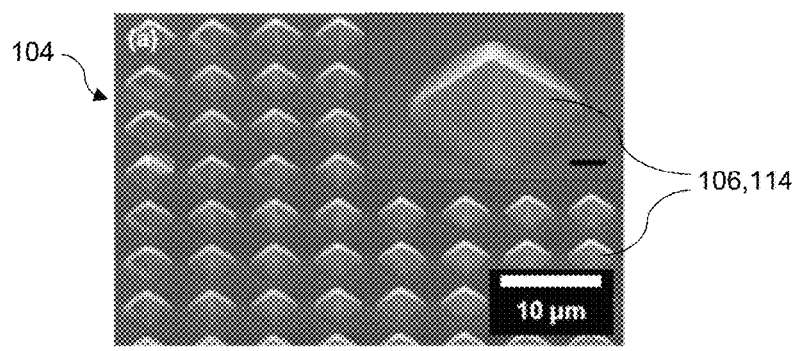
FIG. 2 shows a tilted scanning electron microscope (SEM) image of a textured germanium surface comprising an ordered array of pyramidal protrusions produced by I-MacEtch.
Figure 3:
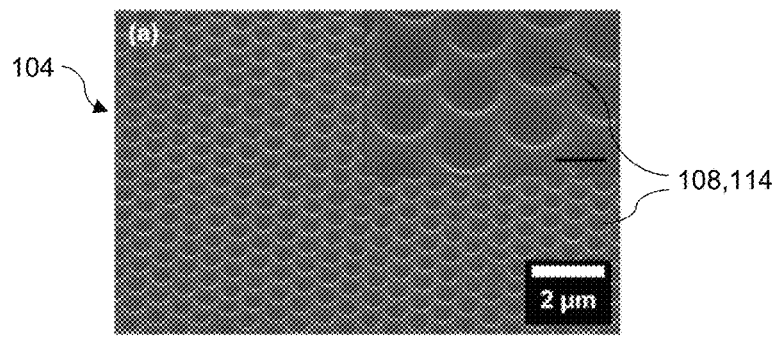
FIG. 3 shows a tilted SEM image of a textured germanium surface comprising an ordered array of circular indentations produced by I-MacEtch.
Figure 4A:
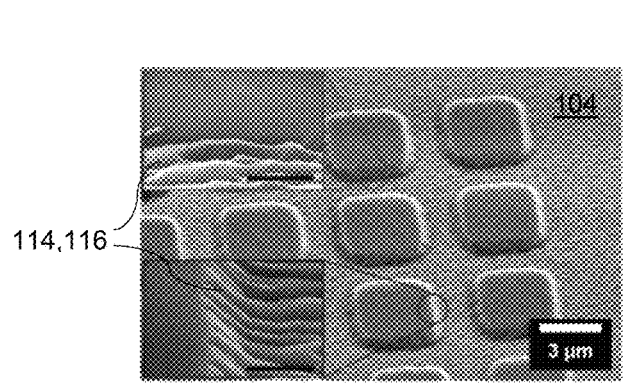
FIGS. 4A and 4B show tilted SEM images of a textured gallium oxide surface comprising grooves produced by I-MacEtch.
Figure 4B:
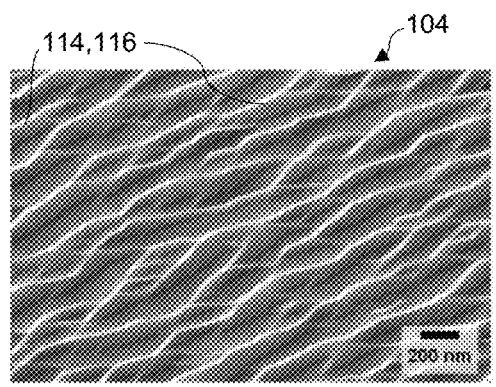

FIG. 1 is a schematic of an exemplary optoelectronic device (specifically a photodetector) having an antireflective surface that may be fabricated by I-MacEtch. The photodetector 100 comprises a semiconductor substrate 102 having a textured surface 104 that includes a plurality of surface protrusions 106 and/or surface indentations 108, which may be more generally referred to as antireflective (AR) features 114. Embodiments of the textured surface 104 are shown in FIGS. 2 through 4B. The AR features 114 may have faceted sidewalls, where each faceted sidewall may be aligned with a crystallographic plane of the semiconductor substrate 102; alternatively, the AR features 114 may comprise rounded or unfaceted sidewalls. In the example of FIG. 2, the surface protrusions 106 comprise pyramids with faceted sidewalls on a Ge (100) substrate. In the example of FIG. 3, the surface indentations 108 comprise circular indentations without facets, which may be described as inverted domes, also formed on a Ge (100) substrate. In the example of FIGS. 4A-4B, the AR features 114 comprise grooves 116 formed on a β-$Ga_2O_3$ (010) substrate. All of these AR features 114 and others may be carved out chemically using I-MacEtch, as described in detail below. The textured surface 104 and the semiconductor substrate 102 may be devoid of ion-induced damage due to the wet chemical etching process. In contrast, conventional methods of creating surface texture, such as reactive ion etching (RIE), involve high energy ions that can displace atoms within the crystal lattice, leading to lattice defects, e.g., surface states, point defects such as vacancies, altered stoichiometry, changes in crystallinity, and/or other damage to the semiconductor substrate.

The AR features 114 may be arranged in an ordered (or periodic) array. In one example, as shown in FIGS. 2 and 3, the periodic array may exhibit two-dimensional periodicity across the textured surface 104. In another example, as shown in FIGS. 4B and 4C, the periodic array may exhibit one-dimensional periodicity across the textured surface 104. Alternatively, the AR features 114 may be arranged in a disordered or random array. The size and spacing of the AR features 114 in the array may range from the nanoscale to the microscale and may be selected based on the wavelengths of light to be detected. It is understood that the term "AR features" may be used interchangeably with "surface protrusions and/or indentations" throughout this disclosure and claims, and it is further understood that pyramidal structures, circular indentations, and grooves as shown in FIGS. 2-4B are non-limiting examples of these AR features 114.

Generally speaking, the AR features 114 may have a lateral size and spacing in a range from about 10 nm to about 10 microns, where the lateral size may be a width or diameter of the AR feature. The lateral size and spacing may be greater than or less than the wavelength of the incident radiation. For example, the lateral size of the AR features 114 may lie in a range from about 10 nm to about 100 nm, from about 100 nm to about 400 nm, from about 400 nm to about 700 nm, from about 700 nm to about 1 micron, from about 1 micron to about 3 microns, from 3 microns to about 5 microns, from about 5 microns to about 7 microns, and/or from about 7 microns about 10 microns. Similarly, the spacing of the AR features 114 may lie in a range from about 10 nm to about 100 nm, from about 100 nm to about 400 nm, from about 400 nm to about 700 nm, from about 700 nm to about 1 micron, from about 1 micron to about 3 microns, from 3 microns to about 5 microns, from about 5 microns to about 7 microns, and/or from about 7 microns to 10 microns. The AR features 114 may have a height or depth in a range from 10 nm to about 10 microns. More specifically, the height or depth of the AR features 114 may lie in one or more of the ranges mentioned above.

The semiconductor substrate 102 may be a single crystal semiconductor substrate comprising a semiconductor such as gallium oxide (e.g., β-$Ga_2O_3$) or germanium, which are discussed further below. Other suitable semiconductors may include GeSn, III-As semiconductors (including GaAs, AlGaAs), III-P semiconductors (including InP, InGaP, GaP), III-Sb semiconductors (including GaSb, AlGaSb, InSb) and III-N semiconductors (including GaN, InGaN, AlGaN), as well as oxides such as ZnO. The semiconductor substrate 102 may have a homogeneous structure or may include a homojunction or heterojunction, such as a p-i-n junction. As indicated above, the semiconductor substrate 102 is substantially devoid of ion-induced damage. In other words, the semiconductor substrate 102 and the textured surface 104 may be substantially devoid of lattice defects that are characteristic of other etching methods, such as RIE. For example, the textured surface 104 formed by I-MacEtch may have at least an order of magnitude fewer surface states (e.g., no more than about $10^{11}/cm^2$) than a surface processed by a dry etching method such as RIE.

β-$Ga_2O_3$ is a wide band gap (WBG) material and an ideal candidate for applications in solar-blind UV photodetectors due to the band-gap energy of ~4.9 eV. In addition, β-$Ga_2O_3$ has advantages over other WBG materials, such as the availability of single crystalline bulk substrates and homoepitaxial growth capability, with controllable n-type doping over the range of $10^{15}$~$10^{20}$ $cm^{-3}$. Ge is an indirect bandgap ($E_g$=0.66 eV) material like silicon that exhibits high photon absorption in the near infrared range (e.g., 1.3-1.55 μm), thus making Ge-based photodetectors suitable for telecommunications applications. Device-grade single crystalline Ge is also commercially available. Importantly, both Ge and β-$Ga_2O_3$ are robust to wet-chemical processing.

Referring again to FIG. 1, a first electrode 110 is in contact with the semiconductor substrate 102, and a second electrode 112, which is spaced apart from the first electrode 110, is also in contact with the semiconductor substrate 102. The first and second electrodes 110,112 may be described as Schottky metal electrodes and may have an interdigitated configuration on the textured surface 104 (as shown) or another configuration. The photodetector may be, for example, a vertical Schottky photodiode or a metal-semiconductor-metal (MSM) photodiode. Ohmic metal contacts may be made on the backside of the semiconductor substrate 102, that is, on the side opposite the textured surface 104. The first and second electrodes 110,112 may comprise one or more metals, such as titanium and/or gold, and may take the form of a patterned thin film formed by methods known in the art. For example, the patterned thin film may be formed by vapor deposition followed by lithographic patterning or by another method, such as direct-write fabrication. The patterned thin film may have a thickness of about 100 nm or less. Due to the nanoscale thickness, the patterned thin film may follow the contours of the textured surface 104, thereby revealing (as opposed to hiding, as a thicker film might do) the AR features 114.

Notably, inverse-MacEtch of Ge may form not only a textured surface but also a layer of amorphous Ge on the single crystal Ge substrate. Thus, the photodetector may include a layer of amorphous Ge 118 sandwiched between each electrode and the single crystal Ge substrate 102, as shown in the scanning transmission electron microscope (STEM) image of FIG. 5A. The amorphous Ge layer 118 may function as a passivation layer and may play an important role in reducing dark current from the photodetector. In one example, the layer of amorphous Ge 118 has a thickness of about 50 nm, but generally speaking the thickness may range from about 10 nm to about 100 nm. In terms of chemical composition, the amorphous layer 118 may consist essentially of Ge; in other words, the layer 118 may be substantially devoid of oxygen or oxides. The chemical composition can be verified by energy dispersive x-ray spectroscopy (EDX). Also or alternatively, the amorphous Ge layer 118 may include sub-nanoscale (e.g., less than 1 nm) domains exhibiting short-range order, which may be identified from fast Fourier transform (FFT) images of the layer 118.

Due to the I-MacEtch process, the β-$Ga_2O_3$ textured surface may exhibit an off-stoichiometric oxygen to gallium (O/Ga) ratio, which may be due to the presence of a thin β-$Ga_2O_x$ (x<3) sub-oxide formed during etching. For example, the oxygen to gallium ratio of the textured surface may be less than 1.5, and in some cases the oxygen to gallium ratio may be less than about 1.4. The oxygen content of the gallium oxide may influence the properties of the photodetector and a reduced level of oxygen at the surface may not be desired. Accordingly, the I-MacEtch conditions may be modified to reduce this effect. The chemical composition of the β-$Ga_2O_3$ surface before and after I-MacEtch is examined by x-ray photoelectron spectroscopy (XPS). The ratio of O1s and Ga2p peak intensities is used to reveal the relative oxygen contents, where the O/Ga ratio is normalized to the stoichiometric value of 1.5. FIG. 5B shows a comparison of the O/Ga ratio as a function of etching times. The O/Ga ratio of β-$Ga_2O_3$ before I-MacEtch is set to 1.5, and it decreases to 1.37 and 1.32 after I-MacEtch for 5 and 10 hours, respectively. The trend of the O/Ga ratio clearly indicates that more oxygen is removed from β-$Ga_2O_3$ than Ga by the process of I-MacEtch. In addition to the O/Ga ratio, an associated change in the band-gap of β-$Ga_2O_3$ may be observed via energy loss spectra of O1s photoelectrons. The band gaps estimated from the energy loss spectra are 4.77 eV and 4.05 eV for β-$Ga_2O_3$ before and after I-MacEtch, respectively. Accordingly, the band gap of the textured gallium oxide surface layer may be reduced by at least about 15% compared to the band gap of the planar gallium oxide surface prior to etching. It is believed that the oxygen deficiency resulting from I-MacEtch may lead to the reduced band-gap.

The use of I-MacEtch to etch the AR features 114 is now described.

FIG. 6 is a schematic of a metal catalyst dot pattern that may be employed to form the array of etched surface protrusions (pyramids) 106 shown in FIG. 2, along with the etching mechanism and process. Generally speaking, I-MacEtch of Ge may be carried out using Au as a metal catalyst formed in any desired pattern on a Ge single crystalline substrate, along with a solution of HF, DI water and $KMnO_4$. Etching may be carried out for a time duration from about 2 minutes to 2 hours, where a time duration from about 10 minutes to about 90 minutes is typical. Etching may take place under ambient conditions, that is, at room temperature (e.g., 20-25° C.) and atmospheric pressure.

In one example, a gold catalyst dot pattern such as that shown in FIG. 6 is formed on a Ge (100) substrate from a gold film of 25 nm in thickness. The Au catalyst dots in the pattern have a diameter and spacing of 5 μm and 2 μm, respectively. I-MacEtch of Ge is carried out using a mixture of HF, DI water, and potassium permanganate ($KMnO_4$). In this example, the concentration of reactants is 0.56 M of HF, 1.1 M of DI water, and 0.32 mM of $KMnO_4$, and etching is carried out for 90 min. $H_2O_2$ is a commonly used oxidant for Si MacEtch. However, it cannot be used for MacEtch of Ge because $H_2O_2$ itself etches Ge without the presence of a metal catalyst. Therefore, a weaker oxidant, potassium permanganate ($KMnO_4$, 1.51 V), which has a redox potential lower than that of $H_2O_2$ (1.763 V), can be employed. It should be noted that Ge with no metal catalyst present is found to be intact under the same etching conditions used to generate the AR structures shown in FIGS. 2 and 3, which indicates that the etching process is indeed metal-assisted.

The inset in FIG. 2 shows a zoomed-in SEM image of a single pyramid having a base width of about 4 µm and height of about 1 µm, where the scale bar in the inset is 1 µm. The size and shape of the pyramids are very uniform across the entire textured surface, which covers an area of 5 mm by 5 mm.

The pyramids are centered at the middle of the Au catalyst dots, indicating that Ge located outside (away from) the metal catalyst area is etched first via I-MacEtch, as expected. The three steps in the pyramid formation process, labeled as (ii), (iii), and (iv) in FIG. 6, correspond to hole diffusion to the off-metal area, Ge removal, and Au lift-off after etching. In contrast to I-MacEtch of InP, which yields fins with vertical sidewalls underneath the catalyst metal, i-MacEtch of Ge may yield pyramids with four distinctive facets. The crystal orientation of the four facets is identified as (111), based on the measured angle (54.7°) with respect to the (100) substrate. Because the etch rate in the <111> direction is the slowest on a (100) Ge substrate, facet formation is attributed to I-MacEtch induced chemical etching.

Figure 7:
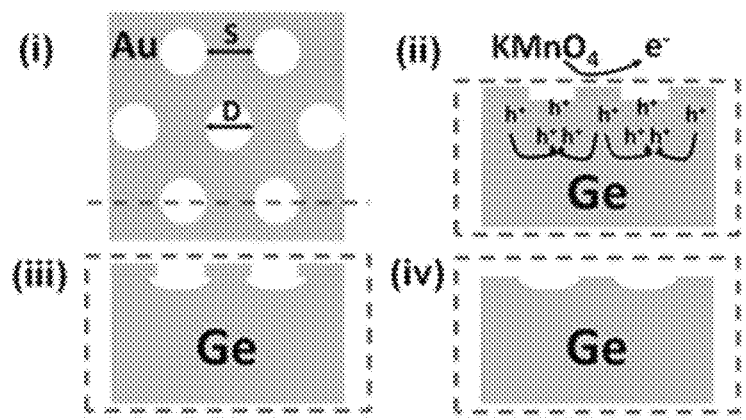
FIG. 7 is a schematic (i) of a metal catalyst mesh pattern that may be employed to form the textured surface shown in FIG. 3, along with the etching mechanism and process (ii-iv).

FIG. 7 shows a schematic drawing of an exemplary Au mesh pattern and an illustration of the formation mechanism of surface indentations. The surface indentations shown in FIG. 3 are formed by I-MacEtch on a Ge (100) substrate using a gold mesh catalyst pattern, such as that shown in FIG. 6. Each circular hole in the mesh pattern has a diameter (D) and spacing (S) of 400 nm in this example. I-MacEtch is carried out using a mixture of HF (0.56 M), DI water (1.1 M), and $KMnO_4$ (0.16 mM) for 10 min. In this example, a considerably shorter etching time is used which yields shallow, circular indentations without discernible crystal facets. The etch recipe and method may be adjusted (e.g., etching time may be increased) using the same Au mesh catalyst pattern to form an array of inverted pyramids with distinct crystal facets.

The inset of FIG. 3 shows a zoomed-in SEM image with a scale bar of 500 nm. As can be seen, the circular indentations of this example have a diameter and spacing of about 600 nm and about 200 nm, respectively, with a depth of about 150 nm. This dimension change with respect to the pattern size (i.e., an increased diameter and decreased spacing compared to the 400 nm hole diameter and spacing) is a result of lateral etching of Ge underneath the periphery of the Au mesh. For formation of both the pyramids of FIG. 2 and the circular indentations of FIG. 3, Ge outside (away from) the Au—Ge interface is preferentially etched first because holes diffuse to the off-metal area due to limited mass transport during etching. Lateral etching underneath the Au pattern then follows and the Au mesh is ultimately completely peeled off due to the lateral (undercut) etching.

Figure 8:
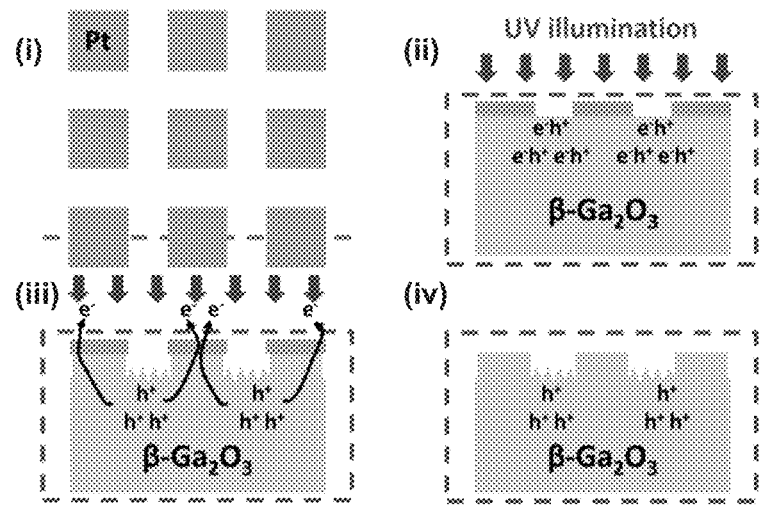
FIG. 8 is a schematic (i) of a metal catalyst pattern that may be employed to form the textured surface shown in FIGS. 4A and 4B, along with the etching mechanism and process (ii-iv).

FIG. 8 illustrates a metal catalyst square array pattern employed to form a $\beta$-$Ga_2O_3$ textured surface, as shown in FIGS. 4A-4B, along with the etching mechanism and process. Generally speaking, I-MacEtch of $\beta$-$Ga_2O_3$ may be carried out using Pt as a metal catalyst formed in any desired pattern on a $\beta$-$Ga_2O_3$ single crystalline substrate, along with a solution of HF and $K_2S_2O_8$. Etching may be carried out for a time duration from about 1 hour to about 24 hours, where a time duration from about 5 hours to 24 hours is typical. Etching may take place under ambient conditions, that is, at room temperature (e.g., 20-25° C.) and atmospheric pressure, and preferably under ultraviolet (UV) radiation.

FIG. 4A shows 45° tilted SEM images of the $\beta$-$Ga_2O_3$ textured surface, which includes grooves between square mesas, where the Pt catalyst was removed before SEM analysis. The square mesas of $\beta$-$Ga_2O_3$ are formed to a depth of about 1 µm after 10 hours of etching in a mixture of HF (0.28 M in this example) and $K_2S_2O_8$ (0.18 mM in this example) under UV irradiation. Importantly, under identical conditions for the same duration, no etching at all is observed if the Pt metal catalyst is not present, confirming the metal-assisted mechanism of the etching process. The areas covered by the Pt metal catalyst are unetched except for some undercut, while areas away from the catalyst are etched, reflecting the i-MacEtch nature. The etched morphology comprises uniformly textured nanoscale grooves substantially aligned towards the same direction. Etch pits formed at early stages of I-MacEtch are enlarged as the etching time increases and merge together to form the nanoscale V-grooves observed here.

FIG. 4A insets show zoomed-in SEM images of the sidewalls of the square mesa parallel to (top) and perpendicular to (bottom) the grooves, respectively. The sidewalls perpendicular to the grooves are completely covered with the grooves, while the sidewalls of the mesa parallel to the grooves are much smoother. Note that the sides of the square mesas in this example are intentionally aligned with the direction of the etched grooves. Since the alignment of the grooves is related to crystallographic direction and does not change with mesa orientation, the mesa sidewall morphology can be controlled by varying the angular orientation of the square mesas with respect to the grooves.

FIGS. 4B and 4C show top view SEM and tilted 3D atomic force microscopy (AFM) images of the nanoscale grooves, which are identified to be aligned along the [100] direction, based on substrate and wafer flat orientations. FIG. 4D shows the corresponding vertical profile along the dotted scan line of the AFM image in FIG. 4C. The dimension of the nanoscale grooves is measured to be approximately 120 and 150 nm for depth and width, respectively.

Note that under the etch conditions in this example, the etched sample (5 mm×5 mm in area) is covered by the V-groove pattern, including those areas adjacent to (e.g., <3 µm from) the square mesas (originally covered by the metal catalyst), as shown in FIG. 4A, and those that are remote (>1 mm) from them. FIG. 4C shows a top view AFM image of the V-groove pattern from those two regions and FIG. 4D shows the corresponding depth distribution. The results indicate that nanoscale grooves may be formed across an entire surface or device area by placing the Pt metal catalyst pattern (e.g., Pt square pads) only on edges and corners of the device sample.

Mechanism of Ge Inverse-MacEtch

The MacEtch process is initiated by holes ($h^+$) generated from the oxidant on the noble metal (catalyst) surface and subsequently diffused to the semiconductor underneath or around the metal. The mechanism is governed by two main steps: carrier generation and mass transport. The first step generates free carriers (holes) by reduction of the oxidant catalyzed by the metal, and the holes are then consumed by first oxidizing the semiconductor directly under the metal. The mass transport refers to the process where the etching reagent dissolves the oxidized semiconductor along the interface of the metal catalyst and semiconductor. However, if the amount of holes injected to the semiconductor is larger than the amount of the holes consumed, the holes are no longer confined under the catalyst, resulting in diffusion of the holes away from the metal-semiconductor interface. Since this area is directly exposed to the acidic solution, the oxidized semiconductor located away from the metal is etched away. Therefore, the etched area is located away from the catalyst pattern, and the catalyst remains at the Ge surface instead of descending into the semiconductor (as in traditional MacEtch); thus the name inverse- or I-MacEtch.

Limited mass transport can play a critical role in I-MacEtch and can be attributed to, in the case of Ge, a strong van der Waals force between Au and Ge as well as the high hole mobility of Ge, as indicated in Table 1 below. This makes hole diffusion to the off-metal area in Ge (i.e., Ge regions away from the metal catalyst) much faster than that in other semiconductor materials.

TABLE 1

Hole mobility and diffusion coefficient of various semiconductor materials.

| | Hole mobility $Cm^2v^{-1}s^{-1}$ | Hole diffusion coefficient $Cm^2s^{-1}$ |
|---|---|---|
| Ge | <1900 | <50 |
| Si | <450 | <12 |
| GaAs | <400 | <10 |
| InP | <200 | <5 |
| GaP | <150 | <4 |
| GaN (ZB) | <350 | 9 |
| GaN (W) | <200 | 5 |

It is hypothesized that, in the HF—$KMnO_4$—$H_2O$ solution, Ge etching is carried out by the chemical reactions set forth below. $KMnO_4$ generates $MnO_4^-$ ions in the aqueous solution, which reacts with $H^+$ to produce holes in the presence of the Au catalyst by equation (1):

$$MnO_4^- + 8H^+ \to Mn^{2+} + 4H_2O + 5h^+ \quad (1)$$

Holes are injected into the Ge substrate, resulting in formation of oxidized Ge. The dissolution process of Ge includes the combination of direct dissolution of Ge and Ge oxide formation followed by dissolution of oxide, which can be described by Eqs. (2) and (3), respectively.

$$Ge + 4h^+ + 4HF \to GeF_4 + 4H^+ \quad (2\text{-}a)$$

$$GeF_4 + 2HF \to H_2GeF_6 \quad (2\text{-}b)$$

$$Ge + 2H_2O + 4h^+ \to GeO_2 + 4H^+ + 4e^- \quad (3\text{-}a)$$

$$GeO_2 + H_2O \to H_2GeO_3 \quad (3\text{-}b)$$

Mechanism of β-$Ga_2O_3$ Inverse-MacEtch

The β-$Ga_2O_3$ MacEtch mechanism may be inverse in nature under ultraviolet (UV) radiation with a platinum catalyst. A mechanism of photoenhanced MacEtch of β-$Ga_2O_3$ using Pt and $K_2S_2O_8$ as the catalyst and oxidant, respectively, is illustrated in FIG. 8(ii-iv). It is noted that localized holes are trapped by local lattice distortions while electrons are mobile in β-$Ga_2O_3$. However, photoexcitation of β-$Ga_2O_3$ can produce electron-hole pairs under above-gap UV illumination (Eq. (4); FIG. 8(ii)).

$$\beta\text{-}Ga_2O_3 + photon \to \beta\text{-}Ga_2O_3 + e^- + h^+ \quad (4)$$

In a HF—$K_2S_2O_8$ solution, the β-$Ga_2O_3$ etching can take place through the following chemical reactions. Photoexcited electrons are consumed by the reduction reactions at the catalyst, as illustrated in FIG. 8(iii). Remaining photoexcited holes can be self-trapped and induce reactions with $Ga_2O_3$ to form gallium ions ($Ga^{3+}$) and oxygen, per Eq. (5). $Ga^{3+}$ further reacts with HF to form gallium fluoride ($GaF_3$) and $H_2$, per Eq. (6).

$$Ga_2O_3 + 6h^+ \to 2Ga^{3+} + 3/2 O_2 \quad (5)$$

$$2Ga^{3+} + 6HF \to 2GaF_3 + 3H_2\uparrow \quad (6)$$

$GaF_3$ is strongly insoluble in water, but it dissolves in HF, in which it forms an adduct with water ($GaF_3.H_2O$). Streams of gas bubbles are clearly observed during the etching process. Note that different etching rates can be obtained due to the anisotropy of β-$Ga_2O_3$ single crystal, which has a monoclinic structure within the space group C2/m.

Ge Textured Surface and Photodetector Characterization

Figure 9:
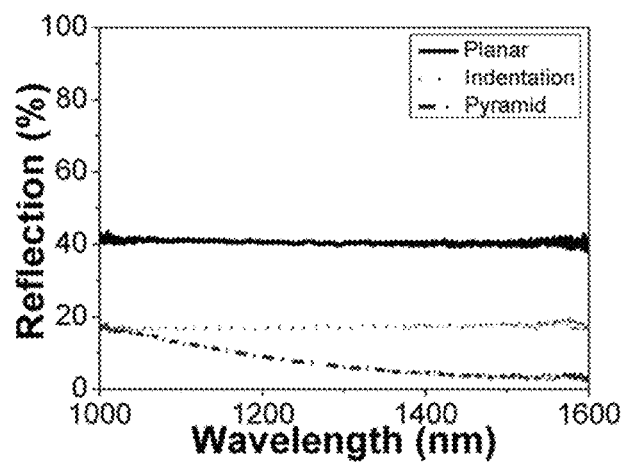
FIG. 9 shows surface reflection spectra of planar and textured Ge surfaces (including pyramidal protrusions or circular indentations) measured in a wavelength range of 1000 nm to 1600 nm.

To evaluate the optical properties of the textured Ge surfaces for the application in optoelectronic devices, surface reflectance spectra are obtained. FIG. 9 shows the measured reflection spectra of polished and textured Ge surfaces, where the textured Ge surfaces include pyramidal and indented structures in this example, when exposed to light having a wavelength in a range from 1000 nm to 1600 nm.

The polished Ge surface reflects approximately 40% of the incoming light, while the textured Ge surface including indentations reflects only about 17% across the same wavelength range. The reflection from the textured Ge surface including pyramidal structures is measured to be 17% at a wavelength of 1000 nm, and it gradually decreases to 3% as the wavelength approaches 1600 nm, as can be observed in FIG. 9. The wavelength dependence for the textured surface including surface protrusions can be explained by resonance (e.g., light multireflection) between adjacent pyramidal structures. In contrast, a wavelength dependence for the textured surface including indented structures is not observed across the wavelength range of 1000 nm to 1600 nm. The light multireflection and resonance do not appear to take effect for the indentation structure, likely due to the relatively small dimension compared to the wavelength.

In order to investigate the reflection at other wavelength ranges below 1000 nm, reflection is simulated using Lumerical finite-difference-time-domain (FDTD) from ultraviolet (UV) to near-infrared (NIR) ranges. For the textured surface including surface protrusions (pyramids), the spectrum follows that of the planar surface but with reduced reflection, perhaps originating from the effect of graded refractive index. In contrast, the textured surface including surface indentations indicates a clear photonic crystal effect with a significant reflection drop at 700 nm as the wavelength approaches the periodicity of the structure.

Overall, the reflection of textured Ge surfaces including AR features (pyramidal or indented structures) is reduced in comparison with a planar Ge surface at UV, visible, and NIR wavelengths. For example, the reflection of a textured surface comprising Ge may be about 20% or less, about 17% or less, about 15% or less, about 10% or less, and as low as about 3%, when exposed to light having a wavelength from about 1000 nm to about 1600 nm. The reflection of the textured Ge surface may be decreased by at least about 50% compared to a planar Ge surface. The improved antireflection properties of the periodically textured Ge surfaces fabricated by I-MacEtch may be applicable for advanced light trapping in Ge-based optoelectronic devices.

Figure 10A:
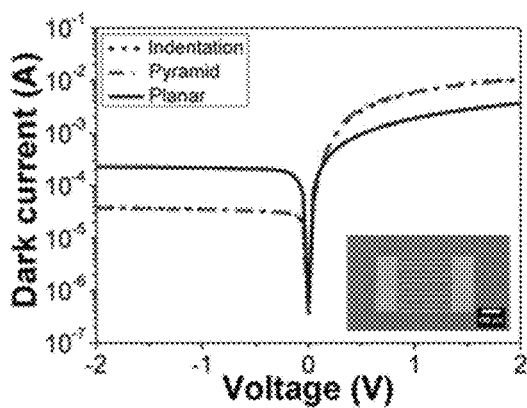
FIGS. 10A and 10B are graphs of dark current and capacitance, respectively, as a function of voltage bias (V) for three types of Ge photodetectors, one with a planar surface, one with a textured surface including pyramidal protrusions, and one with a textured surface including circular indentations; the inset is a top-view SEM image of a fully fabricated photodiode with interdigitated electrodes.

FIG. 10A shows the measured dark current-voltage (I-V) of three types of Ge photodiodes. The photodiode fabricated on the planar surface ("planar photodiode") exhibits a clear rectifying I-V characteristic with an on/off current ratio of 16 at 2/−2 V. Interestingly, the dark current of photodiodes fabricated on the pyramidal and indented textured surfaces is reduced at a negative bias, compared to that of the photodiode on the planar surface. A dark current of 210, 38.6, and 37.4 μA at a voltage bias of −2 V is measured for photodiodes on planar, indented, and pyramidal surfaces, respectively. This leads to an on/off current ratio of 259 and 267 of the photodiodes on indented and pyramidal surfaces at −2 V, which represents more than an order of magnitude of enhancement. Generally speaking, Ge photodiodes having textured surfaces may exhibit an on/off current ratio of at least about 250 at a voltage bias of −2 V.

Figure 10B:
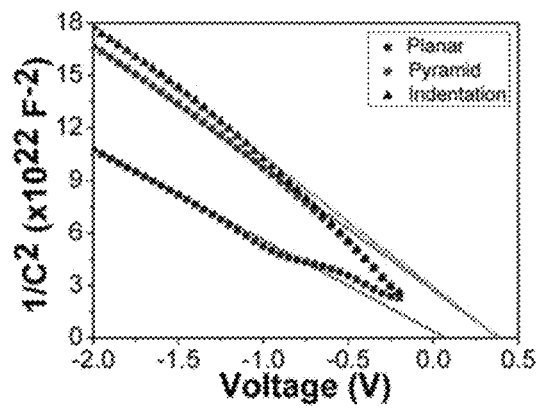

The Ge photodiodes may also exhibit an enhanced Schottky barrier height (SBH) due to the presence of the amorphous Ge (α-Ge) layer on the single-crystalline Ge (c-Ge) substrate. FIG. 10B shows a comparison of capacitance-voltage ($1/C^2$-V) of exemplary photodiode structures measured at 1 MHz under dark conditions. The SBH can be determined by the voltage-axis intercept of the $1/C^2$-V curve. The SBH of the photodiode having a planar surface is estimated to be 0.08 eV, while it increases to 0.4 eV for the photodiodes having textured surfaces with AR features (circular indentations or pyramidal protrusions, in this example). The increased SBH (e.g., at least about 0.3 eV and as high as 0.4 eV or 0.5 eV) is attributed to the α-Ge layer formed on c-Ge as a result of I-MacEtch.

The sensitivity of a photodiode can be evaluated by the spectral responsivity and normalized photocurrent-to-dark current ratio (NPDR). The responsivity is defined by a ratio of the output current (i.e., photo current-dark current) to power of incident light on the device at a specific wavelength. The NPDR is determined by a ratio of the photocurrent to dark current divided by incident light power. A large NPDR indicates suppressed dark current without sacrificing the responsivity. Another important figure of merit of photodiodes is dark current because it is one of the main sources of noise in image sensors. Thus, the sensitivity and dark current of the textured photodiodes are characterized and compared to those of photodiodes made on a planar surface.

Figure 10C:
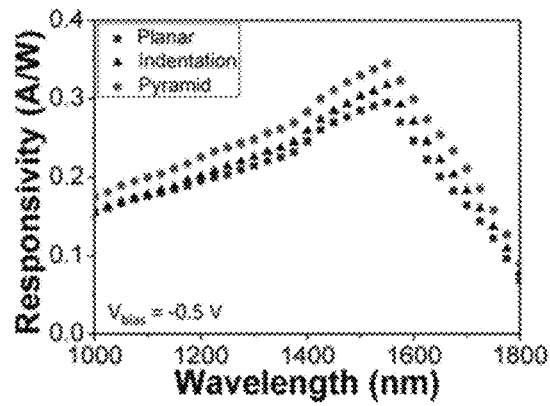
FIGS. 10C and 10D are graphs of responsivity and normalized photocurrent-to-dark current ratio (NPDR) of the Ge photodetectors at −0.5 V as a function of wavelength.
Figure 10D:
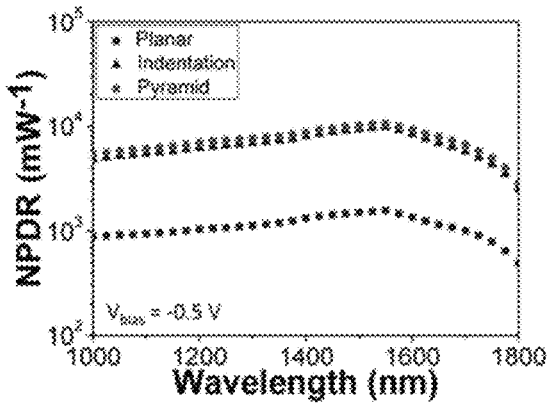

FIGS. 10C and 10D show the responsivity and NPDR, respectively, of photodiodes measured at −0.5 V over a wavelength range from 1000 nm to 1800 nm. The photodiodes fabricated on textured surfaces exhibit enhanced responsivity and NPDR compared to the photodiode fabricated on a planar surface. The measured responsivity of the planar photodiode is 0.16 A/W at 1000 nm, linearly increasing to 0.30 A/W as the wavelength goes to 1550 nm. A maximum responsivity of 0.30 A/W is measured at 1550 nm, and it sharply drops to 0.07 A/W at 1800 nm. This trend can be correlated with direct and indirect band gap energies of Ge of 0.67 and 0.81 eV, which correspond to the wavelength of 1850 and 1530 nm, respectively. Similar behavior, but showing larger responsivity, is observed for photodiodes on textured surfaces (including indented or pyramidal AR features) over the entire wavelength range. A maximum responsivity of 0.30, 0.32, and 0.34 NW is measured from the planar, indented, and pyramidal photodiodes at 1550 nm, respectively. The NPDR of the planar photodiode is in the range of $10^3$ mW$^{-1}$, while that of the photodiodes comprising textured surfaces is approaching $10^4$ mW$^{-1}$, which is more than 5 times higher than the planar photodiode.

To better understand device performance, band diagrams of Ge Schottky photodiodes with and without the α-Ge layer are considered. The dark current of photodiodes having textured surfaces ("textured photodiodes") is believed to be suppressed by the increased SBH, compared to that of photodiodes with planar surfaces. At the same time, the α-Ge layer also impedes the collection of photogenerated holes, which leads to suppressed photo current. Therefore, the effect from the increased SBH on the responsivity of photodiodes without an antireflective surface may not be significant, because both dark and photo currents are reduced. However, a performance enhancement of the textured Ge photodiodes is demonstrated both in lower dark current and higher responsivity and NPDR with respect to the planar photodiode. This indicates that the enhanced responsivity and NPDR may be attributed to both the increased SBH and the reduced surface reflection of the textured surface.

β-Ga$_2$O$_3$ Textured Surface and Photodetector Characterization

Figure 11:
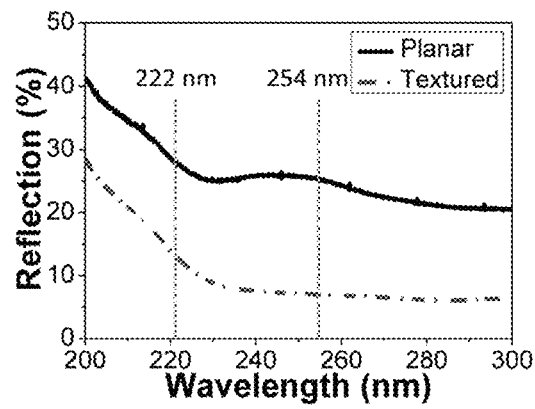
FIG. 11 shows surface reflection spectra of planar and textured β-$Ga_2O_3$ surfaces obtained before and after I-MacEtch measured in a wavelength range of 200 nm to 300 nm.

Optical reflection of β-Ga$_2$O$_3$ semiconductor substrates including textured surfaces (e.g., nanometer-scale V-grooves) is investigated to evaluate the merit of such AR features for light management in β-Ga$_2$O$_3$. FIG. 11 shows the measured surface reflection spectra of planar and textured β-Ga$_2$O$_3$ surfaces at a wavelength range of about 200 nm to about 300 nm. The reflection of the planar surface is measured to be 41.3% at 200 nm and gradually decreases to 20.7% as the wavelength approaches 300 nm. For the textured β-Ga$_2$O$_3$ surface, the reflection is measured to be 28.8% and 6.5% at 200 nm and 300 nm, respectively. The reflection is reduced from 27.7% to 12.7% at 222 nm and from 25.5% to 7.0% at 254 nm, respectively. Accordingly, the textured β-Ga$_2$O$_3$ surface may exhibit a reflection of about 15% or less when exposed to light having a wavelength in a range from 220 nm to about 300 nm, or reflection of about 10% or less when exposed to light having a wavelength in a range from about 250 nm to about 300 nm. Compared to a planar surface, the textured β-Ga$_2$O$_3$ exhibits at least a 60% decrease in reflection at 300 nm. The reduced reflection is ascribed to formation of a graded refractive index, considering that the dimension of the AR features is smaller than the wavelength of incident light.

Figure 12A:
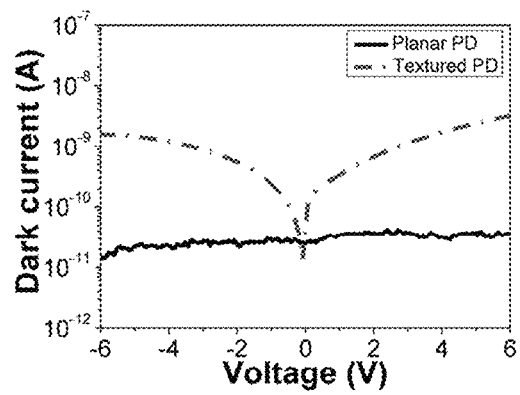
FIGS. 12A to 12D are graphs of dark current, photo current, responsivity and NPDR of β-$Ga_2O_3$ photodiodes as a function of voltage bias at wavelengths of 222 nm and 254 nm.
Figure 12B:
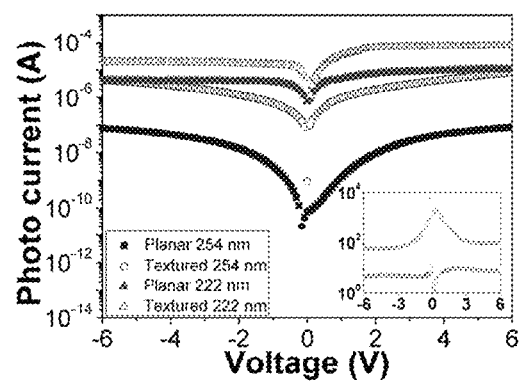

FIGS. 12A and 12B show the dark current and photo current response of photodiodes fabricated on planar and textured β-Ga$_2$O$_3$ surfaces at a bias range of −6 to 6 V. As shown in FIG. 12A, the dark current ($I_d$) of the textured photodiode is increased compared to that of the photodiode on the planar surface in all bias regions except at zero bias. At −6V, it increases to 1.58 nA from 0.0149 nA.

The SBHs between Pt and β-Ga$_2$O$_3$ with planar and textured surfaces are measured to be 1.247 and 1.071 eV, respectively. The decrease in the SBH between Pt and the textured surface may be attributed to sub-oxide formation and thus increased electron affinity of the textured surface. This phenomenon results in an increase of dark current of the textured β-Ga$_2$O$_3$ photodiodes. The nearly two orders of magnitude increase in $I_d$ is attributed to the reduced SBH formed by a thin β-Ga$_2$O$_x$ sub-oxide with a reduced bandgap. FIG. 12B shows photocurrent ($I_p$) of the photodiodes characterized by 254 and 222 nm UV lamps with light intensity of 0.24 and 0.85 μW/cm$^2$, respectively. The $I_p$ of the planar and textured photodiodes is measured to be 0.0774 and 4.35 μA at −6 V under illumination of the 254 nm UV source, respectively. For the 222 nm wavelength, 4.22 and 18.6 μA of $I_p$ were measured at −6 V for the planar and textured photodiodes, respectively. As shown in the inset, the ratio of $I_p$ between the textured and planar photodiodes at 222 nm is reduced by about one order of magnitude, compared to that at 254 nm. This can be explained by higher $I_p$ of the planar photodiodes due to larger absorption coefficient of β-Ga$_2$O$_3$ and light intensity of the lamp at 222 nm. Another reason may be higher reflection from the textured surface at 222 nm, which leads to relatively low increase of $I_p$.

Figure 12C:
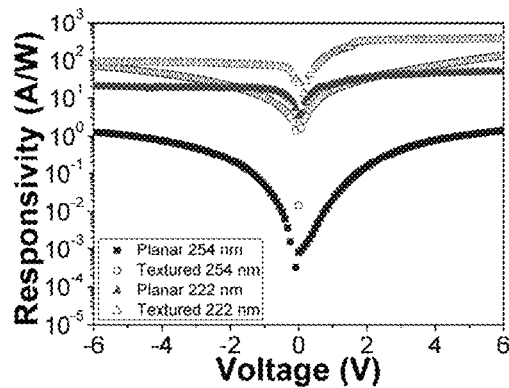

Based on the measurement of the $I_d$ and $I_p$ in the planar and textured β-Ga$_2$O$_3$ photodiodes, responsivity is calculated and plotted in FIG. 12C. Responsivity of the β-Ga$_2$O$_3$ photodiode having the textured surface is enhanced at both 254 and 222 nm, compared to that of the β-Ga$_2$O$_3$ photodiode having the planar surface, due to the increase in $I_p$. Specifically, responsivity at −6 V increases from 1.3 to 71.7

A/W and 19.8 to 87.3 A/W for 254 and 222 nm wavelengths, respectively. However, the degree of responsivity enhancement cannot be explained only by absorption enhancement due to reduced reflection, indicating the existence of high internal gain in the textured photodiodes. It is believed that a thin β-Ga$_2$O$_x$ sub-oxide surface layer, resulting from I-MacEtch, that shows a reduced band-gap and SBH, may be responsible for the high internal gain observed from the textured β-Ga$_2$O$_3$ photodiodes. As indicated above, this sub-oxide layer may be eliminated by modifying the I-MacEtch conditions.

Figure 12D:
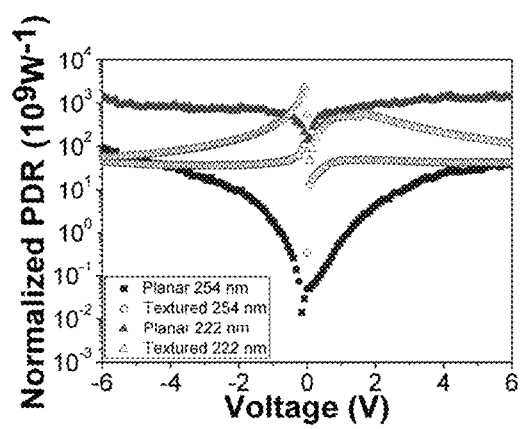

In order to investigate the relationship of $I_d$ and photoresponsivity of the device, normalized $I_p$-to-$I_d$ ratio (NPDR= $(I_p/I_d)/P_{inc}$) is extracted for the planar and textured photodiodes. NPDR is an important figure of merit for MSM photodiodes and a larger value of this parameter indicates overall performance enhancement, considering both dark current and photoresponsivity. FIG. 12D shows the extracted NPDR spectrum at a bias range of −6 to 6 V. For the 254 nm wavelength, more than two orders of magnitude increase in NPDR is observed from the textured photodiode at a small bias range of −1 to 1 V. The ratio of NPDR between planar and textured photodiodes remains over 1 at −4 to 6 V. This indicates that the MacEtch-textured surface of β-Ga$_2$O$_3$ provides a competitive advantage over a planar surface for photodiode applications, despite the increased dark current. However, the ratio of NPDR at 222 nm is smaller than 1 except for the bias range of −0.6 to 0 V. This is due to the fact that the effect from the deterioration of dark current is more dominant than enhanced photocurrent at 222 nm. This is possible because the photo current response of the planar β-Ga$_2$O$_3$ photodiode at 222 nm is much stronger, compared to that of the planar β-Ga$_2$O$_3$ photodiode at 254 nm, which can be observed in FIG. 12B. Therefore, the effect of the textured surface on the enhancement of photodiode performance may become weaker as the wavelength approaches 222 nm.

Experimental Methods—Ge Textured Surfaces

Formation of Textured Surfaces Using I-MacEtch

The processing begins with a thorough cleaning of unintentionally doped c-Ge wafer (Wafer World, Inc. resistivity >40 Ω·cm) with acetone, IPA, and DI water. To form pyramidal AR features, the Ge substrate is first photolithographically patterned with an array of dots. The samples are dipped in 10:1 buffered oxide etch (BOE) for 10 s to remove native oxide and immediately loaded into a CHA SEC-600 e-beam evaporator. Twenty-five nm (thickness) of Au catalyst is e-beam evaporated with a deposition rate of 0.2 A/s and lifted off. To form indented AR features, nanosphere lithography (NSL) technique is used to form planar ordered arrays of polystyrene spheres. A polystyrene bead solution prepared by a standard recipe is spin-coated on Ge samples. The spin-coating process includes three steps: (i) 330 rpm for 8 s (to spread the beads solution evenly); (ii) 300 rpm for 20 s (to spin away the excess bead solution); and (iii) 1700 rpm for 8 s (to spin off the excess materials from the edges). The diameter of the polystyrene beads is reduced to 400 nm by a RIE etch (Diener) with 2 sccm of oxygen at RF power of 500 W and a pressure of 150 mTorr for 8 min. Twenty-five nm-thick Au is deposited on the samples and lifted off by sonicating the samples in IPA. The Ge samples with the Au film are etched in a solution of 49% HF, DI water, and KMnO$_4$, the oxidant. A magnetic stir bar is used to completely dissolve KMnO$_4$ in HF. The array of pyramidal protrusions for the device is formed on the Ge surface by etching in the mixture of KMnO$_4$ (0.32 mM), HF (0.56 M), and DI water (1.1 M) for 90 min. Similarly, nanoscale indentations are realized by the mixture of KMnO$_4$ (0.16 mM), HF (0.28 M), and DI water (0.55 M) for 10 min. Etched samples are rinsed in DI water and dried by nitrogen blow.

Characterization of the Textured Surfaces

Top and tilted views of the etched samples are inspected with scanning electron microscopy (SEM, Hitachi S-4700). X-ray photo electron spectroscopy (XPS, Kratos Axis ULTRA) measurements are carried out on planar and etched Ge surfaces to analyze the chemical composition of the amorphous layer formed on the etched surface. The surface reflection of the Ge pyramidal and indented textured surfaces are measured using a custom-built reflection system over the spectral range from 1000 to 1600 nm at room temperature. The size of the beam spot is approximately 300×300 μm$^2$. The surface reflection of a control sample (planar Ge) is also measured to compare with that of the textured samples.

STEM measurements are performed on a FEI Titan 80-200 electron microscope operated at 200 kV and configured with a CEOS probe aberration corrector, which allows for a resolution of 0.8 Å at 24.5 mrad convergence angle and a 20 pA probe current, measured using the calibrated response of a Gatan US1000 CCD camera (Gatan, Pleasanton, Calif.). By using STEM detector collection angles of 54-270 mrad, the image intensity scales as $Z^\alpha$, where α is in a range of 1.6 to 1.9 and Z is the atomic number of the atoms of the analyzing column. The FEI Titan is equipped with an EDAX X-ray spectrometer (Ametek, Inc., Berwyn, Pa., model PV97-61850 ME, active area 30 mm$^2$, collection angle ~0.09 srad), and the sample rod is rotated to +17° to maximize the x-ray signal collected by the EDX spectrometer. X-ray energy dispersive spectroscopy (EDS) with energy resolution of 132 eV per channel is used to gain compositional information about materials.

Vertical Schottky Ge Photodiode Fabrication and Characterization

Vertical Schottky Ge photodiodes are fabricated on planar and I-MacEtch textured Ge surfaces. Schottky interdigitated metal electrodes (Ti/Au=5/75 nm thickness) are deposited on the planar and textured Ge surfaces. The electrode "fingers" have an 8 μm width, 26 μm spacing, and 290 μm length, as shown in the inset of FIG. 10A. Ohmic metal contacts are made on the back side of the Ge substrates with Ti/Au of 5/75 nm in thickness. Current-voltage (I-V) and capacitance-voltage (1/C$^2$-V) characteristics of the photodiodes are measured using a semiconductor parameter analyzer (Keithley 4200 SCS). Photocurrent is measured using a chopper and a lock-in amplifier (SR850, Stanford Research Systems). Tungsten-halogen lamp (ASBN-W, Spectral Products) is used as a light source and monochromator with a slit width of 500 μm to control the wavelength of light from 1 to 1.8 μm with a step of 0.5 μm. Two lenses are used to focus and control the beam size to ensure that the output beam covers the whole area of the fabricated Ge photodiodes. Light power of each wavelength is carefully measured by a power meter (S132C, Thorlabs).

Experimental Methods—β-Ga$_2$O$_3$ Textured Surfaces

Formation of Textured Surfaces Using I-MacEtch

Starting materials are unintentionally doped (UID) (010) β-Ga$_2$O$_3$ substrates, commercially available from Tamura Co., Ltd. The substrate is diced into 5×5 mm$^2$ squares. The process begins with a thorough cleaning of the samples by acetone, IPA, and DI water. Micro-square arrays are patterned on β-Ga$_2$O$_3$ by standard photolithography and a 15 nm layer of Pt is e-beam evaporated on the surface with a deposition rate of 0.2 Å/s. Size of the square and spacing are 3×3 μm² and 2 μm, respectively. Nine arrays of the squares are formed on the sample to achieve evenly distributed textures on the entire surface.

To carry out etching, the samples with the square array catalyst pattern are immersed in a mixture of hydrofluoric acid (HF, 49%) and potassium persulfate ($K_2S_2O_8$) with a molar concentration of 0.28 M and 0.18 mM, respectively, under illumination of a 254 nm UV lamp for 5 and 10 hours. The UV source-substrate distance is 6 cm.

Characterization of Textured Surfaces

Plain and tilted views of etched surfaces are inspected by scanning electron microscopy (SEM, Hitachi S-4700). Surface profile of the etched β-$Ga_2O_3$ is scanned by atomic force microscopy (AFM, Digital Instruments Nanoscope IIIa Multimode) with Si cantilevers operating in non-contact mode. Surface stoichiometry and band-gap energy of planar and textured layers are measured by x-ray photoelectron spectroscopy (XPS, Kratos Axis ULTRA). Surface reflection spectra of planar and textured β-$Ga_2O_3$ surfaces are measured by a custom-built reflection measurement system at a wavelength range of 200-300 nm.

β-$Ga_2O_3$ Photodiode Fabrication and Characterization

To demonstrate the effectiveness of the textured surface toward enhanced light management of β-$Ga_2O_3$ optoelectronic devices, MSM photodiodes are fabricated on the planar and textured surfaces covered with nanoscale grooves. Interdigitated metal electrodes of Ti/Au (10/80 nm) with an 8 μm width, 26 μm spacing, and 290 μm length are e-beam evaporated on top surfaces. Current-voltage (I-V) characteristics of the devices are measured using a semiconductor parameter analyzer (Keithley 4200). Photo response of the photodiodes fabricated on the planar and texture surface is measured by 222 nm (Eden Park Illumination, Inc.) and 254 nm UV lamps (Raytech). Special care is taken to keep the same measurement conditions for a valid comparison.

The SBHs of metal/β-$Ga_2O_3$ for both the planar and textured surfaces are also characterized. Pt (30 nm) electrodes are deposited in square shapes of 200×200 μm² on the front surface and Ti/Au (20/20 nm) electrodes are deposited on the entire backside of the samples. I-V characteristics of the samples are measured under various temperatures from 323 K to 433 K with a temperature step of 10 K.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. An optoelectronic device with an antireflective surface, the optoelectronic device comprising:
 a semiconductor substrate comprising a textured surface including a plurality of surface protrusions and/or indentations;
 a first electrode in contact with the semiconductor substrate; and
 a second electrode in contact with the semiconductor substrate and spaced apart from the first electrode,
 wherein the semiconductor substrate is substantially devoid of ion-induced defects, and
 wherein the first and second electrodes comprise a patterned thin film having a thickness of about 100 nm or less.

2. The optoelectronic device of claim 1, wherein the semiconductor substrate comprises a homojunction or a heterojunction.

3. The optoelectronic device of claim 1, wherein the semiconductor substrate comprises a semiconductor selected from the group consisting of: gallium oxide and germanium.

4. The optoelectronic device of claim 1, wherein the semiconductor substrate comprises germanium, and
 wherein the semiconductor substrate further comprises an amorphous layer overlying a single crystal, both the amorphous layer and the single crystal comprising the germanium.

5. The optoelectronic device of claim 4, wherein the amorphous layer is substantially devoid of oxygen, the amorphous layer consisting essentially of germanium.

6. The optoelectronic device of claim 1, wherein the semiconductor substrate comprises gallium oxide, and
 wherein the gallium oxide comprises β-$Ga_2O_3$.

7. The optoelectronic device of claim 6, wherein the textured surface has an oxygen to gallium ratio of less than 1.5, the semiconductor substrate including a sub-oxide surface layer comprising β-$Ga_2O_x$, where x<3.

8. The optoelectronic device of claim 1, wherein the plurality of surface protrusions and/or indentations are arranged in a periodic array.

9. The optoelectronic device of claim 8, wherein the periodic array has one-dimensional periodicity, and the surface protrusions and/or indentations comprise grooves.

10. The optoelectronic device of claim 9, wherein the grooves are substantially aligned along a crystallographic direction of the semiconductor substrate.

11. The optoelectronic device of claim 8, wherein the periodic array has two-dimensional periodicity.

12. The optoelectronic device of claim 1, wherein the surface protrusions and/or indentations comprise faceted sidewalls, each faceted sidewall being aligned with a crystallographic plane of the semiconductor substrate.

13. The optoelectronic device of claim 1, wherein the surface protrusions and/or indentations comprise pyramidal structures or circular indentations.

14. The optoelectronic device of claim 1, wherein the surface protrusions and/or indentations have a lateral size and spacing in a range from about 10 nm to about 5 microns.

15. The optoelectronic device of claim 1 being a photodetector or a solar cell.

16. The optoelectronic device of claim 15 being selected from the group consisting of a metal-semiconductor-metal photodetector and a vertical-type Schottky photodetector.

17. The optoelectronic device of claim 1, wherein the first and second electrodes comprise an interdigitated configuration on the textured surface.

18. The optoelectronic device of claim 1, wherein the textured surface comprises Ge and has a surface reflection of about 20% or less when exposed to light having a wavelength from about 1000 nm to about 1600 nm.

19. The optoelectronic device of claim 1, wherein the textured surface comprises β-$Ga_2O_3$ and has a surface reflection of about 15% or less when exposed to light at a wavelength in a range from about 220 nm to about 300 nm.

20. An optoelectronic device with an antireflective surface, the optoelectronic device comprising:

a semiconductor substrate comprising a textured surface including a plurality of surface protrusions and/or indentations;

a first electrode in contact with the semiconductor substrate; and a second electrode in contact with the semiconductor substrate and spaced apart from the first electrode, wherein the semiconductor substrate is substantially devoid of ion-induced defects, wherein the semiconductor substrate comprises gallium oxide, and wherein the gallium oxide comprises $\beta$-$Ga_2O_3$.

21. An optoelectronic device with an antireflective surface, the optoelectronic device comprising:

a semiconductor substrate comprising a textured surface including a plurality of surface protrusions and/or indentations;

a first electrode in contact with the semiconductor substrate; and a second electrode in contact with the semiconductor substrate and spaced apart from the first electrode, wherein the semiconductor substrate is substantially devoid of ion-induced defects, wherein the semiconductor substrate comprises germanium, and wherein the semiconductor substrate further comprises an amorphous layer overlying a single crystal, both the amorphous layer and the single crystal comprising the germanium.

* * * * *